(12) United States Patent
Kim et al.

(10) Patent No.: US 12,537,133 B2
(45) Date of Patent: Jan. 27, 2026

(54) ELECTRONIC COMPONENT

(71) Applicant: SAMSUNG ELECTRO-MECHANICS CO., LTD., Suwon-si (KR)

(72) Inventors: Sangyeop Kim, Suwon-si (KR); Kihun Jeon, Suwon-si (KR); Beomjoon Cho, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 148 days.

(21) Appl. No.: 18/376,102

(22) Filed: Oct. 3, 2023

(65) Prior Publication Data

US 2024/0304382 A1   Sep. 12, 2024

(30) Foreign Application Priority Data

Mar. 7, 2023   (KR) .................. 10-2023-0029934

(51) Int. Cl.
    *H01G 2/06*      (2006.01)
    *H01G 4/232*     (2006.01)
    *H01G 4/30*      (2006.01)

(52) U.S. Cl.
    CPC ............. *H01G 2/065* (2013.01); *H01G 4/232* (2013.01); *H01G 4/30* (2013.01)

(58) Field of Classification Search
    CPC ........... H01G 2/065; H01G 4/232; H01G 4/30
    See application file for complete search history.

(56) References Cited

U.S. PATENT DOCUMENTS

| | | | |
|---|---|---|---|
| 2004/0183147 A1 | 9/2004 | Togashi et al. | |
| 2010/0188798 A1* | 7/2010 | Togashi ............... | H05K 3/3426 361/306.3 |
| 2014/0063687 A1* | 3/2014 | Saito ..................... | H01G 4/228 361/308.1 |

(Continued)

FOREIGN PATENT DOCUMENTS

| | | |
|---|---|---|
| JP | S54-184444 U | 12/1979 |
| JP | H02-45620 U | 3/1990 |

(Continued)

OTHER PUBLICATIONS

Extended European Search Report dated Apr. 2, 2024 issued in European Patent No. 23201034.8.

*Primary Examiner* — Michael P McFadden
(74) *Attorney, Agent, or Firm* — Morgan, Lewis & Bockius LLP

(57) ABSTRACT

An electronic component including: a ceramic main body; first and second external electrodes respectively provided on two opposite end surfaces spaced apart from each other in a longitudinal direction of the ceramic main body; a first metal frame including a first junction part joined to the first external electrode, a first support part extending from the first junction part in the longitudinal direction of the ceramic main body and configured to support the first external electrode, a first base part parallel to the first support part, and a first connection part configured to connect the first support part and the first base part, wherein the first connection part is connected to a point spaced apart from one end of the first support part along the longitudinal direction of the ceramic main body.

19 Claims, 10 Drawing Sheets

(56) References Cited

U.S. PATENT DOCUMENTS

| | | | |
|---|---|---|---|
| 2014/0118882 A1 | 5/2014 | Masuda et al. | |
| 2016/0086730 A1* | 3/2016 | Park | H05K 3/3426 |
| | | | 361/306.3 |
| 2016/0260546 A1* | 9/2016 | Mori | H01G 2/06 |
| 2018/0268996 A1* | 9/2018 | Na | H01G 4/232 |

FOREIGN PATENT DOCUMENTS

| | | |
|---|---|---|
| JP | 2010-177370 A | 8/2010 |
| JP | 2010-186884 A | 8/2010 |
| JP | 2014-072373 A | 4/2014 |
| JP | 2019-067927 A | 4/2019 |
| JP | 2019-149570 A | 9/2019 |
| KR | 10-2016-0094691 A | 8/2016 |

\* cited by examiner

ELECTRONIC COMPONENT

CROSS-REFERENCE TO RELATED APPLICATIONS

This application claims priority to and the benefit of Korean Patent Application No. 10-2023-0029934 filed in the Korean Intellectual Property Office on Mar. 7, 2023, the entire contents of which are incorporated herein by reference.

BACKGROUND

1. Technical Field

The present disclosure relates to an electronic component.

2. Description of the Related Art

Electronic components, which use ceramic materials, include capacitors, inductors, piezoelectric elements, varistors, thermistors, or the like. Among these ceramic electronic components, a multilayer ceramic capacitor (MLCC) has a small size, ensures a high capacity, and is easy to mount. Therefore, the multilayer ceramic capacitor may be used for various electronic devices.

For example, the multilayer ceramic capacitors may be used for chip-shaped condensers mounted on boards of various electronic products such as imaging devices such as liquid crystal display (LCD) devices, plasma display panel (PDP) devices, and organic light-emitting diodes (OLEDs), computers, personal portable terminals, and smartphones and configured to charge the electronic products with electricity or discharge the electronic products.

Recently, the importance of a power drive system mounted in a vehicle has increased with the rapid rise of environmentally friendly vehicles and electric vehicles. Therefore, there is also an increasing demand for the multilayer ceramic capacitor required for the power drive system.

Multilayer ceramic capacitors need to have high levels of thermal reliability, electrical reliability, and mechanical reliability so as to be used as automotive components. In particular, as the density of components mounted in the vehicle increases, there is a need for a multilayer capacitor that may be easy to mount in a limited space, implement a high capacity, and have excellent durability against vibration and deformation.

SUMMARY

The present disclosure has been made in an effort to provide an electronic component that reduces the likelihood of the occurrence of a flex crack in a multilayer ceramic capacitor at the time of mounting the multilayer ceramic capacitor on a substrate.

The present disclosure has also been made in an effort to provide an electronic component including a metal frame capable of securely supporting a multilayer ceramic capacitor.

However, the object to be achieved by the embodiments of the present disclosure is not limited to the above-mentioned object but may be variously expanded without departing from the technical spirit of the present disclosure.

An embodiment of the present disclosure provides an electronic component including: a ceramic main body having a preset length, width, and thickness; first and second external electrodes respectively provided on two opposite end surfaces spaced apart from each other in a longitudinal direction of the ceramic main body; a first metal frame including a first junction part joined to the first external electrode, a first support part extending from the first junction part in the longitudinal direction of the ceramic main body and configured to support the first external electrode, a first base part parallel to the first support part, and a first connection part configured to connect the first support part and the first base part, wherein the first connection part is connected to a point spaced apart from one end of the first support part along the longitudinal direction of the ceramic main body; and a second metal frame including a second junction part joined to the second external electrode, a second support part extending from the second junction part in the longitudinal direction of the ceramic main body and configured to support the second external electrode, a second base part parallel to the second support part, and a second connection part configured to connect the second support part and the second base part, wherein the second connection part is connected to a point spaced apart from one end of the second support part along the longitudinal direction of the ceramic main body.

In addition, the first connection part may be connected to one end of the first base part in the longitudinal direction of the ceramic main body, and the second connection part may be connected to one end of the second base part in the longitudinal direction of the ceramic main body.

In addition, the first base part may extend from one end of the first base part along the longitudinal direction of the ceramic main body toward the first junction part, and the second base part may extend from one end of the second based part along the longitudinal direction of the ceramic main body toward the second junction part.

In addition, the first connection part of the first metal frame and the second connection part of the second metal frame may be spaced apart from each other by a first distance A along the longitudinal direction of the ceramic main body.

In addition, the first support part of the first metal frame and the second support part of the second metal frame may be spaced apart from each other by a second distance B along the longitudinal direction of the ceramic main body.

In addition, the first distance A may be equal to the second distance B or longer than the second distance B.

In addition, the first external electrode may include a first band portion to contact the first support part of the first metal frame, and the second external electrode may include a second band portion to contact the second support part of the second metal frame.

In addition, the second distance B may be 10% or more of the length of the ceramic main body and smaller than a distance G between the first band portion and the second band portion.

In addition, a length F of the first support part may be a distance along the longitudinal direction of the ceramic main body between two opposite ends of the first support part, a third distance C may be a distance along the longitudinal direction of the ceramic main body from one of the two opposite ends of the first support part further from the first junction part, to the point at which the first connection part is connected to the first support part, a fourth distance E may be a distance along the longitudinal direction of the ceramic main body from one of outer peripheral surfaces or imaginary extension thereof of the first junction part, which is further from the ceramic main body, to the point at which the first connection part is connected to the first support part, and the fourth distance E may be 10% or more of the length of the ceramic main body and smaller than the length F of the first support part.

In addition, the third distance C may be smaller than the fourth distance E.

In addition, a length F' of the second support part may be a distance along the longitudinal direction of the ceramic main body between two opposite ends of the second support part, a third distance C' may be a distance along the longitudinal direction of the ceramic main body from one of two opposite ends of the second support part further from the second junction part, to the point at which the second connection part is connected to the second support part, a fourth distance E' may be a distance along the longitudinal direction of the ceramic main body from one of outer peripheral surfaces or imaginary extension thereof of the second junction part, which is further from the ceramic main body, to the point at which the second connection part is connected to the second support part, and the fourth distance E' may be 10% or more of the length of the ceramic main body and smaller than the length F' of the second support part.

In addition, the third distance C' may be smaller than the fourth distance E'.

In addition, the electronic component may further include a first conductive joining layer to join the first junction part to the first external electrode, and a second conductive joining layer to join the second junction part and the second external electrode.

In addition, the first connection part may be connected to a point spaced apart from both ends of the first support part along the longitudinal direction of the ceramic main body.

In addition, the first support part may extend along the longitudinal direction of the ceramic main body and beyond the first band portion.

In addition, the electronic component may further include a first conductive joining layer to join the first junction part to the first external electrode, and the first junction part may extend beyond the first conductive joining layer.

In addition, the first distance A may be equal to the second distance B.

In addition, the first distance A may be longer than the second distance B.

According to the electronic component according to the embodiment, the metal frame is joined to the external electrode of the multilayer ceramic capacitor, such that stresses from the outside may be reduced, and the likelihood of occurrence of flex cracks may be reduced.

In addition, according to the electronic component according to the embodiment, the metal frame securely supports the multilayer ceramic capacitor, thereby preventing the occurrence of defects.

DETAILED DESCRIPTION

Figure 1:
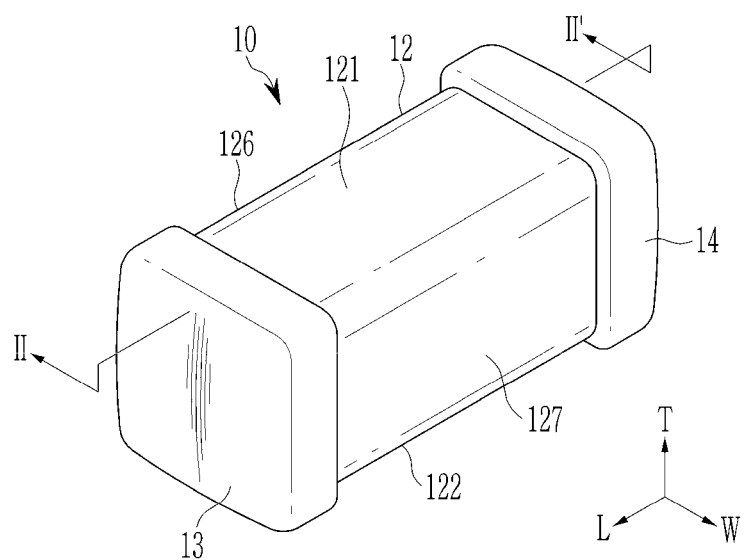
FIG. 1 is a perspective view schematically illustrating a multilayer ceramic capacitor according to an embodiment.

Hereinafter, embodiments of the present disclosure will be described in detail with reference to the accompanying drawings so that those with ordinary skill in the art to which the present disclosure pertains may easily carry out the embodiments. In the drawings, a part irrelevant to the description will be omitted to clearly describe the present disclosure, and the same or similar constituent elements will be designated by the same reference numerals throughout the specification. Some constituent elements in the accompanying drawings are illustrated in an exaggerated or schematic form or are omitted. A size of each constituent element does not entirely represent its actual size.

In addition, it should be interpreted that the accompanying drawings are provided only to allow those skilled in the art to easily understand the embodiments disclosed in the present specification, and the technical spirit disclosed in the present specification is not limited by the accompanying drawings, and includes all alterations, equivalents, and alternatives that are included in the spirit and the technical scope of the present disclosure.

The terms including ordinal numbers such as "first," "second," and the like may be used to describe various constituent elements, but the constituent elements are not limited by the terms. These terms are used only to distinguish one constituent element from another constituent element.

In addition, when one component such as a layer, a film, a region, or a plate is described as being positioned "above" or "on" another component, one component can be positioned "directly on" another component, and one component can also be positioned on another component with other components interposed therebetween. On the contrary, when one component is described as being positioned "directly above" another component, there is no component therebetween. In addition, when a component is described as being positioned "above" or "on" a reference part, the component may be positioned "above" or "below" the reference part, and this configuration does not necessarily mean that the component is positioned "above" or "on" the reference part in a direction opposite to gravity.

Throughout the specification, it should be understood the terms "comprises," "comprising," "includes," "including," "containing," "has," "having" or other variations thereof are inclusive and therefore specify the presence of stated features, integers, steps, operations, elements, components, or combinations thereof, but do not preclude the presence or addition of one or more other features, integers, steps, operations, elements, components, or combinations thereof. Therefore, unless explicitly described to the contrary, the word "comprise/include" and variations such as "comprises/ includes" or "comprising/including" will be understood to imply the inclusion of stated elements, not the exclusion of any other elements.

Throughout the specification, the word "in a plan view" means when an object is viewed from above, and the word "in a cross-sectional view" means when a cross section made by vertically cutting an object is viewed from a lateral side.

In addition, throughout the specification, when one constituent element is referred to as being "connected to" another constituent element, one constituent element can be "directly connected to" the other constituent element, and one constituent element can also be "indirectly connected to," "physically connected to," or "electrically connected to" the other element with other elements therebetween. Further, the constituent elements are defined as different names according to positions or functions thereof, but the constituent elements may be integrated.

Figure 2:
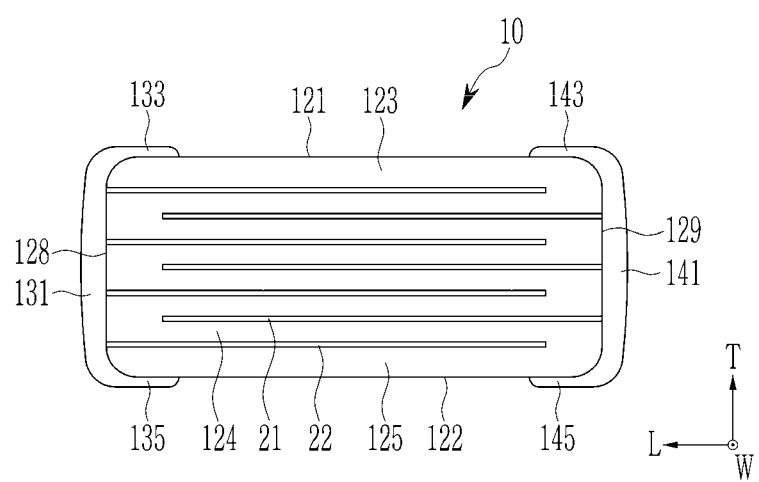
FIG. 2 is a cross-sectional view taken along line II-II' in FIG. 1.

FIG. 1 is a perspective view schematically illustrating a multilayer ceramic capacitor according to an embodiment, and FIG. 2 is a cross-sectional view taken along line II-II' in FIG. 1.

With reference to FIGS. 1 and 2, a multilayer ceramic capacitor 10 includes a ceramic main body 12, first and second external electrodes 13 and 14, and a plurality of first and second internal electrodes 21 and 22.

The ceramic main body 12 may be formed by stacking a plurality of dielectric layers 124 in a thickness direction T and then sintering. Here, the plurality of dielectric layers 124 in the ceramic main body 12, which is disposed adjacent to each other, may be integrated with an indistinct boundary therebetween. For example, the dielectric layers 124 may be integrated to the extent that the boundary between the adjacent dielectric layers 124 of the ceramic main body 12 is difficult to identify without using a scanning electron microscope (SEM).

The ceramic main body 12 may have an approximately hexahedral shape with preset sizes of length, width, and thickness along intersecting directions. However, the present disclosure is not limited thereto. For example, the ceramic main body 12 may have an approximately rectangular parallelepiped shape, but may be rounded in areas corresponding to edges or vertices.

In the present embodiment, for convenience of description, opposing surfaces in the thickness direction T, which is the direction in which the dielectric layers 124 of the ceramic main body 12 are stacked, are respectively defined as an upper surface 121 and a lower surface 122. Opposing surfaces in the longitudinal direction L of the ceramic main body 12, which connect the upper surface 121 and the lower surface 122, are respectively defined as first and second end surfaces 128 and 129. Opposing surfaces in the width direction W of the ceramic main body 12 perpendicularly intersecting the first and second end surfaces 128 and 129 are respectively defined as first and second lateral surfaces 126 and 127.

Meanwhile, in the ceramic main body 12, first and second cover layers 123 and 125 may be respectively disposed at two opposite sides along the thickness direction T of the ceramic main body 12 and provided outside the plurality of first and second internal electrodes 21 and 22.

That is, the first cover layer 123 having a predetermined thickness may be provided on an upper portion of the internal electrode disposed at an uppermost side in the ceramic main body 12, and the second cover layer 125 may be provided on a lower portion of the internal electrode disposed at a lowermost side in the ceramic main body 12.

The first cover layer 123 and the second cover layer 125 may have the same composition as the dielectric layer 124 and be formed by stacking one or more dielectric layers that do not include the internal electrodes, on the upper portion of the internal electrode disposed at the uppermost side of the ceramic main body 12 and the lower portion of the internal electrode disposed at the lowermost side of the ceramic main body 12, respectively.

The first and second cover layers 123 and 125 may serve to prevent the first and second internal electrodes 21 and 22 from being damaged by physical or chemical stress.

The dielectric layer 124 may include a high dielectric constant ceramic material. For example, the ceramic material may include dielectric ceramic containing substances such as $BaTiO_3$, $CaTiO_3$, $SrTiO_3$, or $CaZrO_3$. In addition, the substances may further include auxiliary substances such as a Mn compound, a Fe compound, a Cr compound, a Co compound, and a Ni compound. For example, the dielectric layer may be $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, or the like, in which Ca (calcium), Zr (zirconium), or the like are partially dissolved in $BaTiO_3$. However, the present disclosure is not limited thereto.

In addition, the dielectric layer 124 may further include one or more of ceramic additives, organic solvents, plasticizers, binders, and dispersants. For example, the ceramic additive may be a transition metal oxide or carbide, a rare-earth element, magnesium (Mg), aluminum (Al), or the like.

For example, an average thickness of the dielectric layer 111 may be 0.5 μm to 10 μm. However, the present disclosure is not limited thereto.

The first and second external electrodes 13 and 14 may be formed by conductive paste containing conductive metal. For example, the first and second external electrodes 13 and 14 may be formed by dipping a ceramic main body in a conductive paste. The conductive metal may include nickel (Ni), copper (Cu), palladium (Pd), gold (Au), or an alloy thereof. However, the present disclosure is not limited thereto.

The first and second external electrodes 13 and 14 are respectively disposed at two opposite ends along the longitudinal direction L of the ceramic main body 12 and respectively include first and second body portions 131 and 141, first band portions 133 and 143, and second band portions 135 and 145.

The first body portion 131 is a portion electrically connected to exposed ends of the first and second internal electrodes 21 and 22 while covering the first end surface 128 along the longitudinal direction L of the ceramic main body 12.

The second body portion 141 is a portion electrically connected to exposed ends of the first and second internal electrodes 21 and 22 while covering the second end surface 129 along the longitudinal direction L of the ceramic main body 12.

The first band portions 133 and 143 may extend along the longitudinal direction L of the ceramic main body 12 from the first and second body portions 131 and 141 and may cover portions of the upper surface 121 of the ceramic main body 12, which are disposed at the two opposite ends of the ceramic main body 12, and portions of the first and second lateral surfaces 126 and 127, which are disposed at the two opposite ends of the ceramic main body 12.

The second band portions 135 and 145 may extend along the longitudinal direction L of the ceramic main body 12 from the first and second body portions 131 and 141 and may cover portions of the lower surface 122 of the ceramic main body 12, which are disposed at the two opposite ends of the ceramic main body 12, and portions of the first and second lateral surfaces 126 and 127 of the ceramic main body 12, which are disposed at the two opposite ends of the ceramic main body 12.

The first and second external electrodes 13 and 14 may each include nickel (Ni), copper (Cu), palladium (Pd), gold (Au), or an alloy thereof. Meanwhile, the first and second external electrodes 13 and 14 may include a plurality of layers. For example, the first and second external electrodes 13 and 14 may each be made of a combination of nickel (Ni), copper (Cu), nickel/copper (Ni/Cu), palladium/nickel (Pd/Ni), palladium/nickel/copper (Pd/Ni/Cu), and copper/nickel/copper (Cu/Ni/Cu).

In some instances, a layer disposed at an outermost side of each of the first and second external electrodes 13 and 14 may be configured as a tin (Sn) plating layer. Because the tin plating layer has a relatively low melting point, it is possible to improve ease of mounting the first and second external electrodes 13 and 14 on a board.

In general, the tin plating layer may be coupled to an electrode pad on the board through a solder containing a tin-copper-silver (Sn—Cu—Ag) alloy paste. That is, the tin plating layer may be melted and bonded to the solder during a heat treatment (reflow) process.

The plurality of first and second internal electrodes 21 and 22 are alternately stacked with the dielectric layers 124 interposed therebetween. The first and second internal electrodes 21 and 22 may be formed and stacked on a ceramic sheet configured to constitute the dielectric layer 124, and then the first and second internal electrodes 21 and 22 may be provided in the ceramic main body 12 and alternately disposed in the thickness direction T with the single dielectric layer 124 interposed therebetween by sintering. The first and second internal electrodes 21 and 22 are electrodes having different polarities. The first and second internal electrodes 21 and 22 may be disposed to face each other in a direction in which the dielectric layers 124 are stacked. The first and second internal electrodes 21 and 22 may be electrically insulated from each other by the dielectric layer 124 disposed between the first and second internal electrodes 21 and 22.

The first and second internal electrodes 21 and 22 are disposed in a staggered manner in the longitudinal direction with the dielectric layer 124 interposed therebetween. One end of the first internal electrode 21 and one end of the second internal electrode 22 are respectively exposed through the first and second end surfaces 128 and 129 in the longitudinal direction L of the ceramic main body 12. The ends of the first and second internal electrodes 21 and 22, which are alternately exposed through the first and second end surfaces 128 and 129 in the longitudinal direction of the ceramic main body 12 as described above, may be respectively disposed on the first and second end surfaces 128 and 129 in the longitudinal direction L of the ceramic main body 12 and electrically connected to the first and second body portions 131 and 141 of the first and second external electrodes 13 and 14. In addition, the first and second internal electrodes 21 and 22 may each be made of a conductive metal, which may include, for example, nickel (Ni), a nickel (Ni) alloy, or the like. However, the present disclosure is not limited thereto.

With the above-mentioned configuration, electric charges are accumulated between the first and second internal electrodes 21 and 22, which face each other, when a predetermined voltage is applied to the first and second external electrodes 13 and 14. Here, the capacitance of the multilayer ceramic capacitor 10 is proportional to an overlap area in which the first and second internal electrodes 21 and 22 overlap each other in the direction along which the dielectric layers 124 are stacked.

Figure 3:
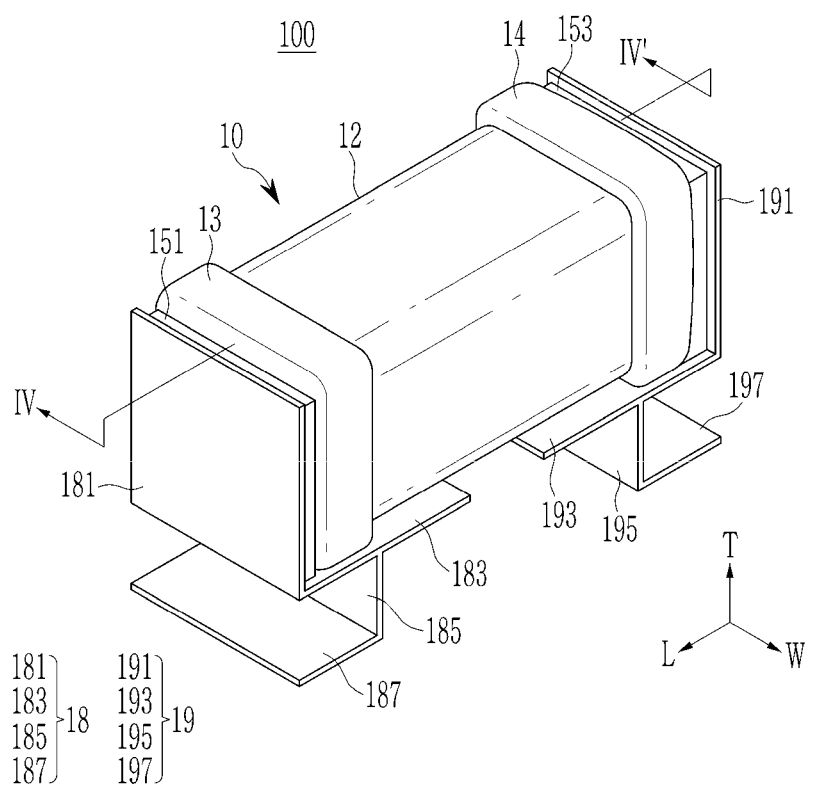
FIG. 3 is a perspective view schematically illustrating an electronic component according to the embodiment.
Figure 4:
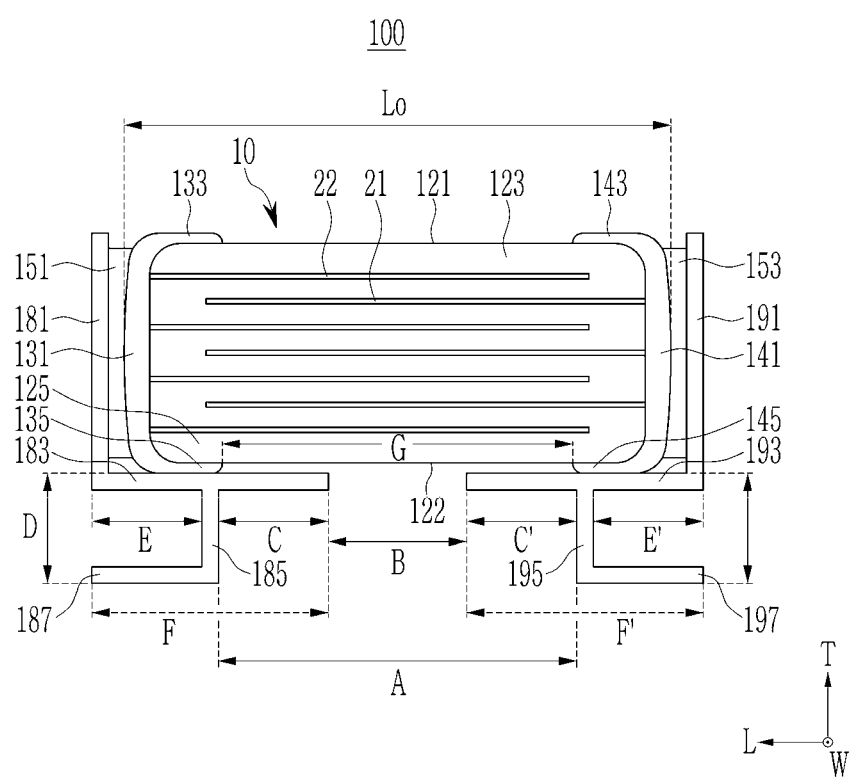
FIG. 4 is a cross-sectional view taken along line IV-IV' in FIG. 3.

FIG. 3 is a perspective view schematically illustrating an electronic component according to an embodiment, and FIG. 4 is a cross-sectional view taken along line IV-IV' in FIG. 3.

With reference to FIGS. 3 and 4, an electronic component 100 includes a multilayer ceramic capacitor 10 and first and second metal frames 18 and 19.

Because the multilayer ceramic capacitor 10 has been described above, a description thereof will be omitted.

The first metal frame 18 includes a first junction part 181, a first support part 183, a first connection part 185, and a first base part 187.

The first junction part 181 is joined to the first body portion 131 of the first external electrode 13 and extends in the thickness direction T of the ceramic main body 12. For example, the first junction part 181 may be a plate-shaped member having a uniform thickness.

The first junction part 181 is joined to the first external electrode 13 by a first conductive joining layer 151. The first conductive joining layer 151 may comprise a high-temperature solder, a conductive bonding member, or the like. However, the present disclosure is not limited thereto.

The first support part 183 extends from a lower end of the first junction part 181 in the longitudinal direction L of the ceramic main body 12 and supports the first external electrode 13.

No separate bonding member is provided in the area where the first support part 183 and the first external electrode 13 are in contact. That is, the first support part 183 and the first external electrode 13 may be in direct contact with each other.

If a multilayer ceramic capacitor is mounted on a board and the board bends, flex cracks may form near the areas where an edge of the external electrode adjoins the ceramic main body. However, the structure of the present embodiment, in which the first support part 183 supports the first external electrode 13, may protect areas where flex cracks are likely to form. Therefore, according to the present embodiment, it is possible to reduce a likelihood of the occurrence of flex cracks.

Meanwhile, if an electronic component is repeatedly exposed to high and low temperature environments in a temperature cycle evaluation, the bonding force of the conductive joining layer joining the metal frame and the external electrode of the multilayer ceramic capacitor may be weakened, causing the metal frame to be separated from the external electrode of the multilayer ceramic capacitor. However, the structure of the present embodiment, in which the first support part 183 supports the first external electrode 13, may reduce the likelihood of the metal frame 18 separating from the external electrode 13 even if the bonding force of the conductive joining layer 151 is weakened. A second support part 193 to be described below also has the same effect as the first support part 183 because the second support part 193 supports the second external electrode 14 in the same way as the first support part 183.

The first connection part 185 extends from the first support part 183 in the thickness direction T of the ceramic main body 12 and connects the first support part 183 and the first base part 187. The first connection part 185 is connected to one end of the first base part 187 in the longitudinal direction L of the ceramic main body 12. The first base part 187 extends from one end thereof in the longitudinal direction L of the ceramic main body 12 toward the end surface 128 of the ceramic main body 12.

The first base part 187 may be parallel to the first support part 183. That is, the first base part 187 may extend in the longitudinal direction L of the ceramic main body 12.

The second metal frame 19 includes a second junction part 191, the second support part 193, a second connection part 195, and a second base part 197.

The second junction part 191 is joined to the second body portion 141 of the second external electrode 14 and extends in the thickness direction T of the ceramic main body 12. For example, the second junction part 191 may be a plate-shaped member having a uniform thickness.

The second junction part 191 is joined to the second external electrode 14 by a second conductive joining layer 153. The second conductive joining layer 153 may comprise a high-temperature solder, a conductive bonding member, or the like. However, the present disclosure is not limited thereto.

The second support part 193 extends from a lower end of the second junction part 191 in the longitudinal direction L of the ceramic main body 12 and supports the second external electrode 14.

No separate bonding member is provided in the area where the second support part 193 and the second external electrode 14 are in contact. That is, the second support part 193 and the second external electrode 14 may be in direct contact with each other.

The second connection part 195 extends from the second support part 193 in the thickness direction T of the ceramic main body 12 and connects the second support part 193 and the second base part 197. The second connection part 195 is connected to one end of the second base part 197. The second base part 197 extends from one end thereof in the longitudinal direction L of the ceramic main body 12 toward the end surface 129 of the ceramic main body 12.

The second base part 197 may be parallel to the second support part 193. That is, the second base part 197 may extend in the longitudinal direction L of the ceramic main body 12.

The first connection part 185 of the first metal frame 18 and the second connection part 195 of the second metal frame 19 may be spaced apart from each other by a first distance A in the longitudinal direction L of the ceramic main body 12.

The first support part 183 of the first metal frame 18 and the second support part 193 of the second metal frame 19 may be spaced apart from each other by a second distance B in the longitudinal direction L of the ceramic main body 12. Here, the second distance B may be 10% or more of a length $L_0$ of the ceramic main body 12. If the second distance B is less than 10% of the length $L_0$ of the ceramic main body 12, an arc discharge current value increases, which may cause burnout. The second distance B may be smaller than a distance G between the first band portion 135 of the first external electrode 13 and the second band portion 145 of the second external electrode 14. If the second distance B is larger than the distance G, it may be difficult for the metal frame to sufficiently protect the external electrode.

Here, the first distance A may be equal to the second distance B or greater than the second distance B.

Meanwhile, the characteristics of the electronic component 100 may vary depending on a ratio (A/D) of the first distance A to an interval D between the first support part 183 and the first base part 187 of the first metal frame 18. Here, the interval D means a distance between one of the two opposite surfaces of the first base part 187, which is further from the first support part 183 in the thickness direction T of the ceramic main body 12, and one of the two opposite surfaces of the first support part 183, which is further from the first base part 187 in the thickness direction T of the ceramic main body 12.

The bending strength characteristics are improved as A/D decreases, i.e., as the first distance A is smaller than the interval D. When the first distance A is relatively small, the metal frames 18 and 19 may better withstand external forces transmitted through the first base part 187 and the first connection part 185 and through the second base part 197 and the second connection part 195, resulting in improved bending strength characteristics of the electronic component 100.

However, as the first distance A decreases, the arc discharge current value increases, which increases the likelihood of burnout, and as the interval D increases, the path through which the electric current passes increases, increasing the equivalent series resistance (ESR) and increasing the thickness of the chip.

In contrast, as A/D increases, i.e., as the first distance A is larger than the interval D, the bending strength characteristics deteriorate, while the ESR decreases and the thickness of the chip decreases.

The first connection part 185 of the first metal frame 18 is connected to a point spaced apart from one end of the first support part 183.

The point at which the first connection part 185 is connected to the first support part 183 is a point spaced apart, by a third distance C along the longitudinal direction L of the ceramic main body 12, from one of the two opposite ends of the first support part 183 that is opposite to the first junction part 181. In other words, the point is a point spaced apart, by a fourth distance E, from the first junction part 181 in the longitudinal direction L of the ceramic main body 12. A length F of the first support part 183 may be a sum of the third distance C and the fourth distance E if a thickness of the first connection part 185 is ignored. That is, E+C=F. Here, the third distance C means a distance along the longitudinal direction L of the ceramic main body 12 from one of the two opposite ends of the first support part 183, which is opposite to the first junction part 181, to the point at which the first connection part 185 is connected to the first support part 183. The fourth distance E means a distance along the longitudinal direction L of the ceramic main body 12 from one of the outer peripheral surfaces or imaginary extension thereof of the first junction part 181, which is further from the ceramic main body 12, to the point at which the first connection part 185 is connected to the first support part 183. The length F of the first support part 183 means a distance along the longitudinal direction L of the ceramic main body 12 between the two opposite ends of the first support part 183.

The fourth distance E may be 10% or more of the length $L_0$ of the ceramic main body 12 and less than the length F of the first support part 183. When the fourth distance E is 10% or more of the length $L_0$ of the ceramic main body 12, a contact surface for attaching the electronic component 100 to the board can be secured.

If the third distance C becomes larger than the fourth distance E, the first distance A also becomes larger, which degrades the bending strength characteristics, but reduces the arc discharge current value. In contrast, if the third distance C becomes smaller than the fourth distance E, the first distance A also becomes smaller, which improves the bending strength characteristics, but increases the arc discharge current value, which increases the likelihood of burnout.

Meanwhile, the second connection part 195 of the second metal frame 19 is connected to a portion spaced apart from one end of the second support part 193 by a predetermined distance.

The point at which the second connection part 195 is connected to the second support part 193 is a point spaced apart, by a third distance C' along the longitudinal direction L of the ceramic main body 12, from one of the two opposite ends of the second support part 193 that is opposite to the second junction part 191. In other words, the point is a point spaced apart, by a fourth distance E' along the longitudinal direction L of the ceramic main body 12, from the second junction part 191. A length F' of the second support part 193 may be a sum of the third distance C' and the fourth distance E' if a thickness of the second connection part 195 is ignored. That is, E'+C'=F'. Here, the third distance C' means a distance along the longitudinal direction L of the ceramic main body 12 from one of the two opposite ends of the second support part 193, which is opposite to the second junction part 191, to the point at which the second connection part 195 is connected to the second support part 193. The fourth distance E' means a distance along the longitudinal direction L of the ceramic main body 12 from one of the outer peripheral surfaces of imaginary extension thereof of the second junction part 191, which is further from the ceramic main body 12, to the point at which the second connection part 195 is connected to the second support part 193. The length F' of the second support part 193 means a distance along the longitudinal direction L of the ceramic main body 12 between the two opposite ends of the second support part 193 in the longitudinal direction L of the ceramic main body 12.

The fourth distance E' may be 10% or more of the length $L_0$ of the ceramic main body 12 and less than the length F' of the second support part 193. When the fourth distance E' is 10% or more of the length $L_0$ of the ceramic main body 12, a contact surface for attaching the electronic component 100 to the board can be secured.

If the third distance C' becomes larger than the fourth distance E', the first distance A also becomes larger, which degrades the bending strength characteristics, but reduces the arc discharge current value. In contrast, if the third distance C becomes smaller than the fourth distance E, the first distance A also becomes smaller, which improves the bending strength characteristics, but increases the arc discharge current value, which increases the likelihood of burnout.

Figure 5:
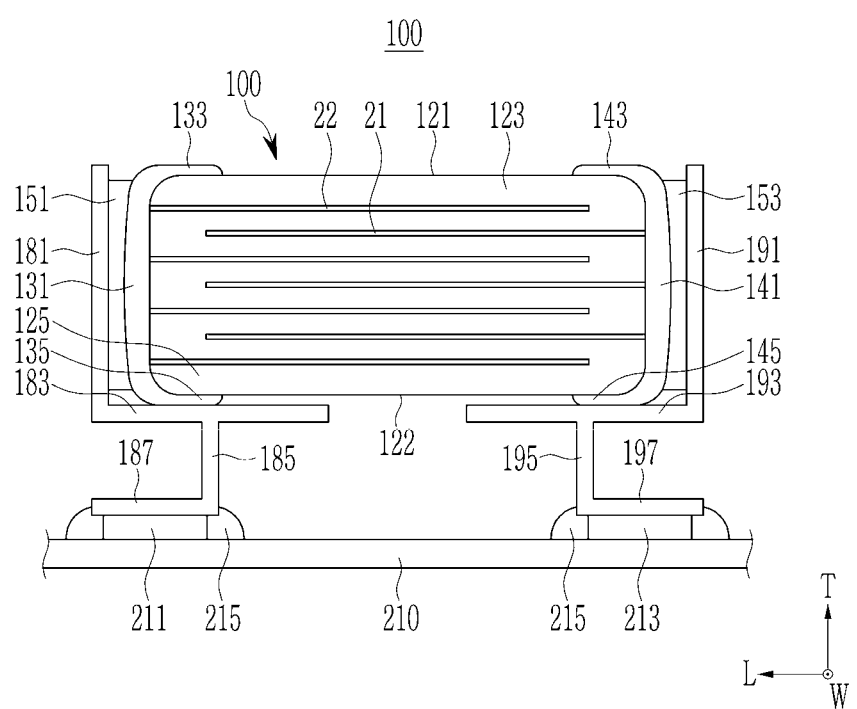
FIG. 5 is a schematic cross-sectional view illustrating a state in which the electronic component illustrated in FIG. 3 is mounted on a circuit board.

FIG. 5 is a schematic cross-sectional view illustrating a state in which the electronic component illustrated in FIG. 3 is mounted on a circuit board.

With reference to FIG. 5, the electronic component 100 is connected to first and second electrode pads 211 and 213 provided on an upper surface of a circuit board 210 by means of conductive bonding members 215. That is, the electronic component 100 may be mounted on the circuit board 210 by means of the first and second electrode pads 211 and 213.

The first and second electrode pads 211 and 213 may be disposed on the upper surface of the circuit board 210 and spaced apart from each other. The first and second base parts 187 and 197 of the first and second metal frames 18 and 19 of the electronic component 100 may be fixed to the circuit board 210 by means of the conductive bonding members 215 in a state in which the first and second base parts 187 and 197 are disposed to be in contact with the first and second electrode pads 211 and 213. Therefore, the electronic component 100 may be electrically connected to the first and second electrode pads 211 and 213 of the circuit board 210. For example, the conductive bonding member 215 may include solder.

In the present embodiment, the first and second metal frames 18 and 19 of the electronic component 100 are respectively fixed to the first and second electrode pads 211 and 213 by the conductive bonding members 215, such that the first and second metal frames 18 and 19 are mounted on the circuit board 210.

Figure 6:
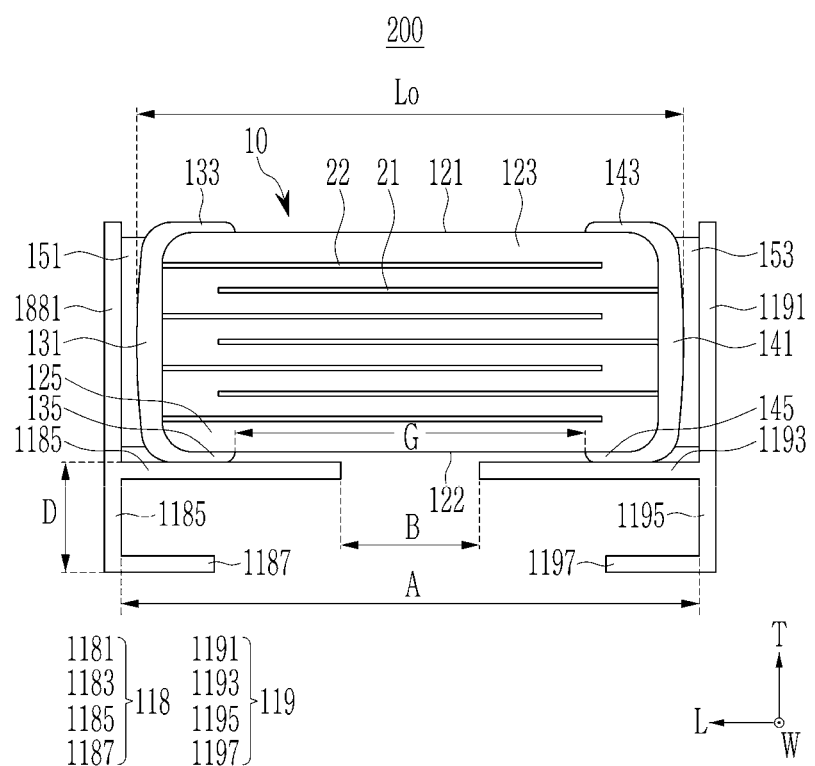
FIG. 6 is a cross-sectional view schematically illustrating an electronic component according to another embodiment.

FIG. 6 is a cross-sectional view schematically illustrating an electronic component according to another embodiment.

With reference to FIG. 6, an electronic component 200 includes the multilayer ceramic capacitor 10 and first and second metal frames 118 and 119.

Because the multilayer ceramic capacitor 10 has been described above, a description thereof will be omitted.

The first metal frame 118 includes a first junction part 1181, a first support part 1183, a first connection part 1185, and a first base part 1187.

The first junction part 1181 is joined to the first body portion 131 of the first external electrode 13 and extends in the thickness direction T of the ceramic main body 12. For example, the first junction part 1181 may be a plate-shaped member having a uniform thickness.

The first junction part 1181 is joined to the first external electrode 13 by the first conductive joining layer 151. The first conductive joining layer 151 may comprise a high-temperature solder, a conductive bonding member, or the like. However, the present disclosure is not limited thereto.

The first support part 1183 extends from a lower end of the first junction part 1181 in the longitudinal direction L of the ceramic main body 12 and supports the first external electrode 13.

No separate bonding member is provided in the area where the first support part 1183 and the first external electrode 13 are in contact. That is, the first support part 1183 and the first external electrode 13 may be in direct contact with each other.

If a multilayer ceramic capacitor is mounted on a board and the board bends, flex cracks may from near the areas where an edge of the external electrode adjoins the ceramic main body. However, the structure of the present embodiment, in which the first support part 1183 supports the first external electrode 13, may protect areas where flex cracks are likely to form. Therefore, according to the present embodiment, it is possible to reduce a likelihood of the occurrence of flex cracks.

Meanwhile, if an electronic component is repeatedly exposed to high and low temperature environments in a temperature cycle evaluation, the bonding force of the conductive joining layer joining the metal frame and the external electrode of the multilayer ceramic capacitor may be weakened, causing the metal frame to be separated from the external electrode of the multilayer ceramic capacitor. However, the structure of the present embodiment, in which the first support part 1183 supports the first external electrode 13, may reduce the likelihood of the metal frame 18 separating from the external electrode 13 even if the bonding force of the conductive joining layer 151 is weakened. A second support part 1193 to be described below also has the same effect as the first support part 1183 because the second support part 1193 supports the second external electrode 14 in the same way as the first support part 1183.

The first connection part 1185 extends from the first junction part 1181 in the thickness direction T of the ceramic main body 12 and is connected to one end of the first base part 1187. The first junction part 1181 and the first connection part 1185 may define different regions of the same plate-shaped member. The first base part 1187 extends in the longitudinal direction L of the ceramic main body 12 from a point to which the first connection part 1185 is connected. The first base part 1187 extends in a direction opposite to the end surface 128 of the ceramic main body 12.

The second metal frame 119 includes a second junction part 1191, the second support part 1193, a second connection part 1195, and a second base part 1197.

The second junction part 1191 is joined to the second body portion 141 of the second external electrode 14 and extends in the thickness direction T of the ceramic main body 12. For example, the second junction part 1191 may be a plate-shaped member having a uniform thickness.

The second junction part 1191 is joined to the second external electrode 14 by the second conductive joining layer 153. The second conductive joining layer 153 may comprise a high-temperature solder, a conductive bonding member, or the like. However, the present disclosure is not limited thereto.

The second support part 1193 extends from the second junction part 1191 in the longitudinal direction L of the ceramic main body 12 and supports the second external electrode 14.

No separate bonding member is provided in the area where the second support part 1193 and the second external electrode 14 are in contact. That is, the second support part 1193 and the second external electrode 14 may be in direct contact with each other.

The second connection part 1195 extends from the second junction part 1191 in the thickness direction T of the ceramic main body 12 and is connected to one end of the second base part 1197. The second junction part 1191 and the second connection part 1195 may define different regions of the same plate-shaped member. The second base part 1197 extends in the longitudinal direction L of the ceramic main body 12 from a point to which the second connection part 1195 is connected. The second base part 1197 extends in a direction opposite to the end surface 129 of the ceramic main body 12.

The first connection part 1185 of the first metal frame 118 and the second connection part 1195 of the second metal frame 119 may be spaced apart from each other by the first distance A in the longitudinal direction L of the ceramic main body 12.

The first support part 1183 of the first metal frame 118 and the second support part 1193 of the second metal frame 119 may be spaced apart from each other by the second distance B in the longitudinal direction L of the ceramic main body 12. Here, the second distance B may be 10% or more of the length $L_0$ of the ceramic main body 12. If the second distance B is less than 10% of the length $L_0$ of the ceramic main body 12, an arc discharge current value increases, which may cause burnout. The second distance B may be smaller than the distance G between the first band portion 135 of the first external electrode 13 and the second band portion 145 of the second external electrode 14. If the second distance B is larger than the distance G, it may be difficult for the metal frame to sufficiently protect the external electrode.

Here, the first distance A may be larger than the second distance B.

Meanwhile, the characteristics of the electronic component may vary depending on the ratio (A/D) of the first distance A to the interval D between the first support part 1183 and the first base part 1187 of the first metal frame 118. Here, the interval D means a distance between one of the two opposite surfaces of the first base part 1187, which is further from the first support part 1183 in the thickness direction T of the ceramic main body 12, and one of the two opposite surfaces of the first support part 1183, which is further from the first base part 1187 in the thickness direction T of the ceramic main body 12.

The bending strength characteristics are improved as A/D decreases, i.e., as the first distance A is smaller than the interval D. When the first distance A is relatively small, the metal frames 18 and 19 may better withstand external forces transmitted through the first base part 1187 and the first connection part 1185 and through the second base part 1197 and the second connection part 1195, resulting in improved bending strength characteristics of the electronic component 200. As the interval D increases, the path through which the electric current passes increases, increasing the equivalent series resistance (ESR) and increasing the thickness of the chip.

In contrast, as A/D increases, i.e., as the first distance A is larger than the interval D, the bending strength characteristics deteriorate, while the ESR decreases and the thickness of the chip decreases.

Figure 7:
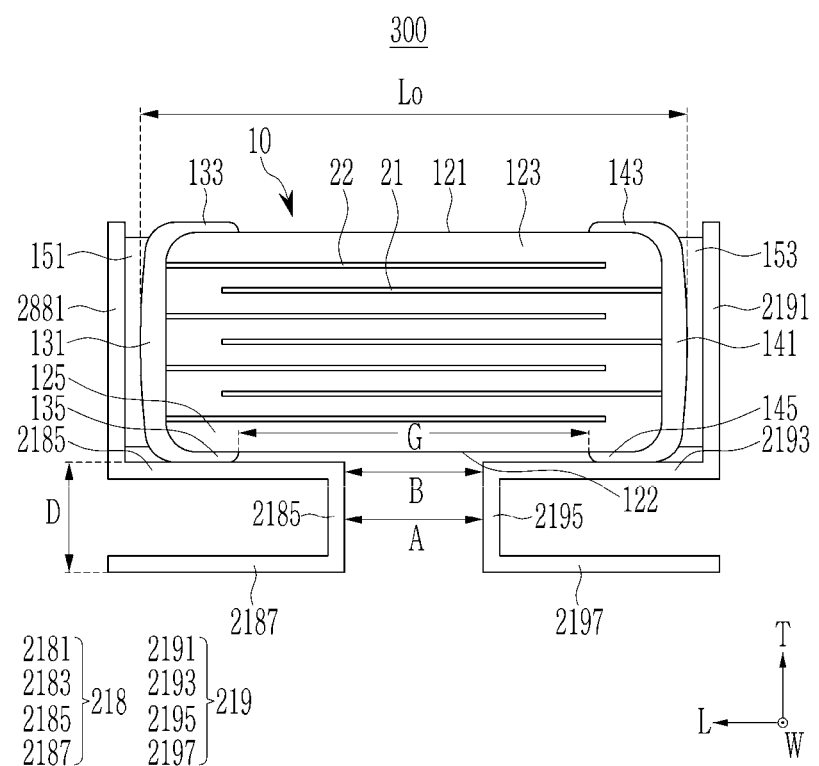
FIG. 7 is a cross-sectional view schematically illustrating an electronic component according to still another embodiment.

FIG. 7 is a cross-sectional view schematically illustrating an electronic component according to still another embodiment.

With reference to FIG. 7, an electronic component 300 includes the multilayer ceramic capacitor 10 and first and second metal frames 218 and 219.

Because the multilayer ceramic capacitor 10 has been described above, a description thereof will be omitted.

The first metal frame 218 includes a first junction part 2181, a first support part 2183, a first connection part 2185, and a first base part 2187.

The first junction part 2181 is joined to the first body portion 131 of the first external electrode 13 and extends in the thickness direction T of the ceramic main body 12. For example, the first junction part 2181 may be a plate-shaped member having a uniform thickness.

The first junction part 2181 is joined to the first external electrode 13 by the first conductive joining layer 151. The first conductive joining layer 151 may comprise a high-temperature solder, a conductive bonding member, or the like. However, the present disclosure is not limited thereto.

The first support part 2183 extends from a lower end of the first junction part 2181 in the longitudinal direction L of the ceramic main body 12 and supports the first external electrode 13.

No separate bonding member is provided in the area where the first support part 2183 and the first external electrode 13 are in contact. That is, the first support part 2183 and the first external electrode 13 may be in direct contact with each other.

If a multilayer ceramic capacitor is mounted on a board and the board bends, flex cracks may form near the areas where an edge of the external electrode adjoins the ceramic main body. However, the structure of the present embodiment, in which the first support part 2183 supports the first external electrode 13, may protect areas where flex cracks are likely to form. Therefore, according to the present embodiment, it is possible to reduce a likelihood of the occurrence of flex cracks.

Meanwhile, if an electronic component is repeatedly exposed to high and low temperature environments in a temperature cycle evaluation, the bonding force of the conductive joining layer joining the metal frame and the external electrode of the multilayer ceramic capacitor may be weakened, causing the metal frame to be separated from the external electrode of the multilayer ceramic capacitor. However, the structure of the present embodiment, in which the first support part 2183 supports the first external electrode 13, may reduce the likelihood of the metal frame 18 separating from the external electrode 13 even if the bonding force of the conductive joining layer 151 is weakened. A second support part 2193 to be described below also has the same effect as the first support part 2183 because the second support part 2193 supports the second external electrode 14 in the same way as the first support part 2183.

The first connection part 2185 extends from the first support part 2183 in the thickness direction T of the ceramic main body 12 and is connected to the first base part 2187. One of the two opposite ends in the longitudinal direction L of the ceramic main body 12 of the first support part 2183, which is opposite to the end surface 128 of the ceramic main body 12, and one of the two opposite ends in the longitudinal direction L of the ceramic main body 12 of the first base part 2187, which is opposite to the end surface 128 of the ceramic main body 12, are connected to each other by the first connection part 2185. The first base part 2187 extends in the longitudinal direction L of the ceramic main body 12 toward the end surface 128 of the ceramic main body 12.

The first base part 2187 may be parallel to the first support part 2183. That is, the first base part 2187 may extend in the longitudinal direction L of the ceramic main body 12.

The second metal frame 2119 includes a second junction part 2191, the second support part 2193, a second connection part 2195, and a second base part 2197.

The second junction part 2191 is joined to the second body portion 141 of the second external electrode 14 and extends in the thickness direction T of the ceramic main body 12. For example, the second junction part 2191 may be a plate-shaped member having a uniform thickness.

The second junction part 2191 is joined to the second external electrode 14 by the second conductive joining layer 153. The second conductive joining layer 153 may comprise a high-temperature solder, a conductive bonding member, or the like. However, the present disclosure is not limited thereto.

The second support part 2193 extends from a lower end of the second junction part 2191 in the longitudinal direction L of the ceramic main body 12 and supports the second external electrode 14.

No separate bonding member is provided in the area where the second support part 2193 and the second external electrode 14 are in contact. That is, the second support part 2193 and the second external electrode 14 may be in direct contact with each other.

The second connection part 2195 extends from second support part 2193 in the thickness direction T of the ceramic main body 12 and is connected to the second base part 2197. One of the two opposite ends in the longitudinal direction L of the ceramic main body 12 of the second support part 2193, which is opposite to the end surface 129 of the ceramic main body 12, and one of the two opposite ends in the longitudinal direction L of the ceramic main body 12 of the second base part 2197, which is opposite to the end surface 129 of the ceramic main body 12, are connected to each other by the second connection part 2195. The second base part 2197 extends in the longitudinal direction L of the ceramic main body 12 toward the end surface 129 of the ceramic main body 12.

The second base part 2197 may be parallel to the second support part 2193. That is, the second base part 2197 may extend in the longitudinal direction L of the ceramic main body 12.

The first connection part 2185 of the first metal frame 2118 and the second connection part 2195 of the second metal frame 2119 may be spaced apart from each other by the first distance A in the longitudinal direction L of the ceramic main body 12.

The first support part 2183 of the first metal frame 2118 and the second support part 2193 of the second metal frame 2119 may be spaced apart from each other by the second distance B in the longitudinal direction L of the ceramic main body 12. Here, the second distance B may be 10% or more of the length $L_0$ of the ceramic main body 12. If the second distance B is less than 10% of the length $L_0$ of the ceramic main body 12, an arc discharge current value increases, which may cause burnout. The second distance B may be smaller than the distance G between the first band portion 135 of the first external electrode 13 and the second band portion 145 of the second external electrode 14. If the second distance B is larger than the distance G, it may be difficult for the metal frame to sufficiently protect the external electrode.

Here, the first distance A may be equal to the second distance B.

Meanwhile, the characteristics of the electronic component may vary depending on the ratio (A/D) of the first distance A to the interval D between the first support part 2183 and the first base part 2187 of the first metal frame 2118. Here, the interval D means a distance between one of the two opposite surfaces of the first base part 2187, which is further from the first support part 2183 in the thickness direction T of the ceramic main body 12, and one of the two opposite surfaces of the first support part 2183, which is further from the first base part 2187 in the thickness direction T of the ceramic main body 12.

The bending strength characteristics are improved as A/D decreases, i.e., as the first distance A is smaller than the interval D. When the first distance A is relatively small, the metal frames 18 and 19 may better withstand external forces transmitted through the first base part 2187 and the first connection part 2185 and through the second base part 2197 and the second connection part 2195, resulting in improved bending strength characteristics of the electronic component 300.

However, as the first distance A decreases, the arc discharge current value increases, which increases the likelihood of burnout, and as the interval D increases, the path through which the electric current passes increases, increasing the equivalent series resistance (ESR) and increasing the thickness of the chip.

In contrast, as A/D increases, i.e., as the first distance A is larger than the interval D, the bending strength characteristics deteriorate, while the ESR decreases and the thickness of the chip decreases.

The distances, lengths, widths, and thicknesses disclosed herein may be measured using, for example, microscopy techniques such as optical microscopy and electron microscopy. Other methods and/or tools appreciated by one of ordinary skill in the art, even if not described in the present disclosure, may also be used.

EXAMPLES

Figure 8:
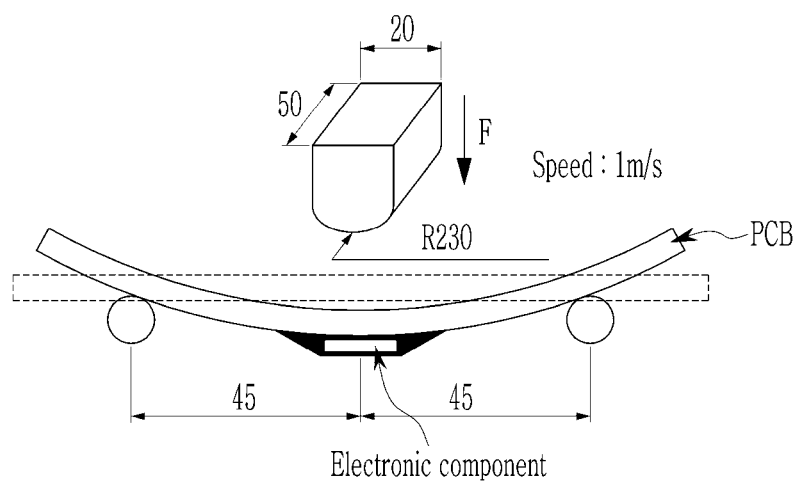
FIG. 8 is a view illustrating a method for measuring the bending strength of an electronic component.
Figure 9:
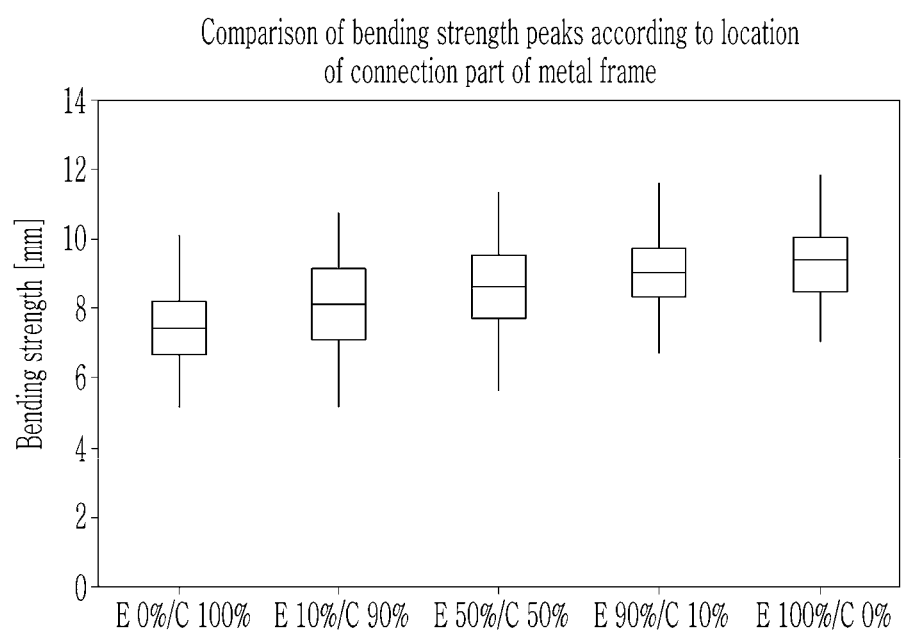
FIG. 9 is a graph illustrating a comparison of the occurrence of the bending strength peaks based on the location of a connection portion of a metal frame.

Table 1 shows the bending strength according to the location of the connection part of the metal frame of the electronic component according to the embodiment, FIG. 8 is a view illustrating a method for measuring the bending strength of an electronic component, and FIG. 9 is a graph illustrating a comparison of the occurrence of the bending strength peak according to the location of the connection part of the metal frame of the electronic component.

Sixty electronic components each having a metal frame bonded to a multilayer ceramic capacitor having length× width of 3.2 mm×2.5 mm were mounted for respective conditions on a standard bending strength evaluation board (thirty electronic components mounted in a horizontal direction and thirty electronic components mounted in a vertical direction), and bending strength was measured. As shown in FIG. 8, a multilayer ceramic capacitor with a metal frame, i.e., an electronic component, was mounted on a printed circuit board (PCB). A load was applied to the center of the opposite side of the mounting surface to determine whether peel-off, in which the external electrode of the multilayer ceramic capacitor separates from the ceramic body, or cracking, in which the ceramic body breaks, occurs.

The bending strength guaranteed peak value of the multilayer ceramic capacitor typically required in this technical field needs to be about 6 mm, and the bending strength guaranteed peak value of the electronic component having the metal frame bonded to the multilayer ceramic capacitor also needs to be about 6 mm or more.

TABLE 1

| E/C | 0/100 | 10/90 | 50/50 | 90/10 | 100/0 |
|---|---|---|---|---|---|
| Average Bending Strength Value [mm] | 8.09 | 8.72 | 9.24 | 9.69 | 9.90 |
| Maximum Bending Strength Value [mm] | 9.69 | 10.32 | 10.92 | 11.20 | 11.40 |
| Minimum Bending Strength Value [mm] | 6.79 | 6.74 | 7.30 | 8.40 | 8.74 |
| Standard Deviation | 0.75 | 1.12 | 0.88 | 0.73 | 0.74 |

$(E + C = F = 100\%)$

With reference to Table 1 and FIG. 9, it can be seen that the bending strength guaranteed peak value (about 6 mm or more) is satisfied regardless of the ratio of the fourth distance E (see FIG. 4) to the third distance C (see FIG. 4) of the metal frame.

However, it can be seen that the bending strength increases as the ratio of the fourth distance E (see FIG. 4) to the third distance C (see FIG. 4) of the metal frame increases.

An increase in the ratio of the fourth distance E to the third distance C means that the first distance A decreases. When the first distance A becomes relatively small, the metal frame may better withstand external forces transmitted through the connection part and the base part of the metal frame, which can lead to better bending strength characteristics of the electronic component. That is, as the connection part of the metal frame is disposed closer to the center along the longitudinal direction of the multilayer ceramic capacitor, the bending strength characteristics of the electronic component may be improved.

Figure 10:
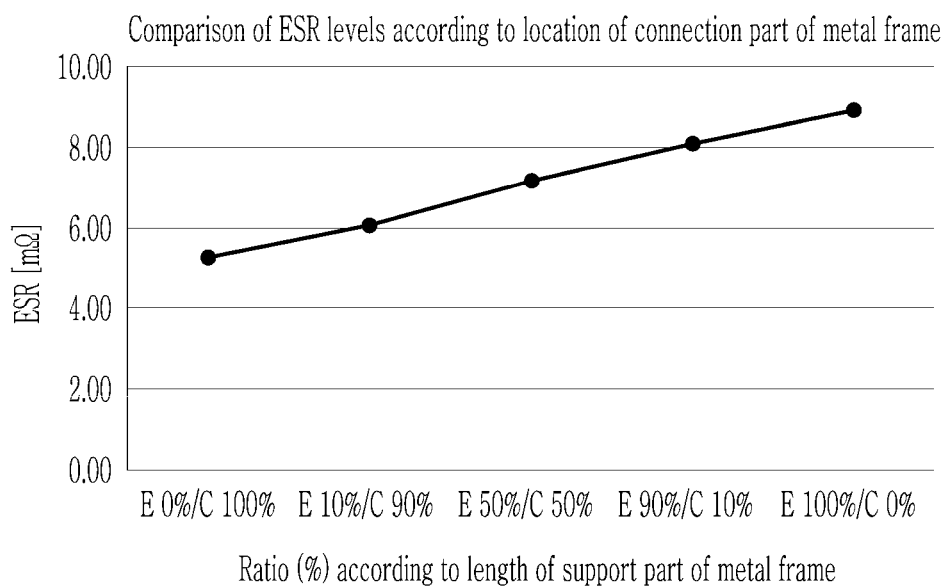
FIG. 10 is a graph illustrating a comparison of equivalent series resistance (ESR) measurements based on the location of the connection portion of the metal frame.

Table 2 shows equivalent series resistance (ESR) measurements based on the location of the connection part of the metal frame of the electronic component according to the embodiment, and FIG. 10 is a graph illustrating a comparison of ESR levels based on the location of the connection part of the metal frame of the electronic component.

Here, the ESR measurements of each electronic component represent the results of measurements using an LCR meter in a manner conventional in the present technical field.

TABLE 2

| E/C | 0/100 | 10/90 | 50/50 | 90/10 | 100/0 |
|---|---|---|---|---|---|
| ESR Average Value | 5.27 | 6.03 | 7.17 | 8.09 | 8.90 |
| ESR Maximum Value | 7.67 | 7.3 | 8.17 | 9.27 | 10.2 |
| ESR Minimum Value | 4.12 | 4.92 | 5.81 | 6.17 | 7.97 |

With reference to FIG. 10 and Table 2, it can be seen that the ESR measurement increases as the ratio of the fourth distance E (see FIG. 4) to the third distance C (see FIG. 4) of the metal frame increases.

An increase in the ratio of the fourth distance E to the third distance C means that the first distance A decreases. If the first distance A becomes relatively small, the path through which the electric current passes increases, which may lead to higher ESR measurements. Conversely, if the first distance A becomes relatively large, the path through which the electric current passes decreases, which may result in lower ESR measurements.

In other words, as the connection part of the metal frame of the electronic component is farther from the central portion along the longitudinal direction of the multilayer ceramic capacitor (i.e., closer to the external electrode), the path through which the electric current passes decreases, which may lead to lower ESR measurements. As the connection part of the metal frame is closer to the central portion along the longitudinal direction of the multilayer ceramic capacitor, the path through which the electric current passes increases, which may lead to higher ESR measurements.

As described above, the electronic component according to the embodiment has a structure in which the metal frame is joined to the external electrode of the multilayer ceramic capacitor.

According to the structure, the bending strength increases as the ratio of the fourth distance E (see FIG. 4) to the third distance C (see FIG. 4) of the metal frame increases. The measured value of ESR increases as the ratio of the fourth distance E (see FIG. 4) to the third distance C (see FIG. 4) of the metal frame increases.

That is, the bending strength characteristics of the electronic component are improved as the connection part of the metal frame is disposed closer to the central portion along the longitudinal direction of the multilayer ceramic capacitor, while as the connection part of the metal frame is disposed closer to the central portion along the longitudinal direction of the multilayer ceramic capacitor, the path through which the electric current passes increases, which may lead to higher ESR measurement. As described above, because the trade-off relationship is established between the bending strength characteristics and the ESR measurements, the location of the connection part of the metal frame may be adjusted to match the required characteristics of the electronic component.

While the embodiments of the present disclosure have been described above, the present disclosure is not limited thereto, and various modifications can be made and carried out within the scope of the claims, the detailed description of the present disclosure, and the accompanying drawings, and also fall within the scope of the present disclosure.

What is claimed is:

1. An electronic component comprising:
a ceramic main body having a preset length, width, and thickness;
first and second external electrodes respectively provided on two opposite end surfaces spaced apart from each other in a longitudinal direction of the ceramic main body;
a first metal frame comprising a first junction part joined to the first external electrode, a first support part extending from the first junction part in the longitudinal direction of the ceramic main body and configured to support the first external electrode, a first base part parallel to the first support part, and a first connection part configured to connect the first support part and the first base part, wherein the first connection part is connected to a point spaced apart from both ends of the first support part along the longitudinal direction of the ceramic main body; and
a second metal frame comprising a second junction part joined to the second external electrode, a second support part extending from the second junction part in the longitudinal direction of the ceramic main body and configured to support the second external electrode, a second base part parallel to the second support part, and a second connection part configured to connect the second support part and the second base part,
wherein the second connection part is connected to a point spaced apart from one end of the second support part along the longitudinal direction of the ceramic main body.

2. The electronic component of claim 1, wherein:
the first connection part is connected to one end of the first base part in the longitudinal direction of the ceramic main body, and
wherein the second connection part is connected to one end of the second base part in the longitudinal direction of the ceramic main body.

3. The electronic component of claim 2, wherein:
the first base part extends from one end of the first base part and along the longitudinal direction of the ceramic main body toward the first junction part, and
the second base part extends from one end of the second base part and along the longitudinal direction of the ceramic main body toward the second junction part.

4. The electronic component of claim 1, wherein:
the first connection part of the first metal frame and the second connection part of the second metal frame are spaced apart from each other by a first distance A along the longitudinal direction of the ceramic main body.

5. The electronic component of claim 4, wherein:
the first support part of the first metal frame and the second support part of the second metal frame are spaced apart from each other by a second distance B along the longitudinal direction of the ceramic main body.

6. The electronic component of claim 5, wherein:
the first distance A is equal to the second distance B or longer than the second distance B.

7. The electronic component of claim 6, wherein:
the first external electrode comprises a first band portion to contact the first support part of the first metal frame, and
the second external electrode comprises a second band portion to contact the second support part of the second metal frame.

8. The electronic component of claim 7, wherein:
the second distance B is 10% or more of the length of the ceramic main body and smaller than a distance G between the first band portion and the second band portion.

9. The electronic component of claim 7, wherein the first support part extends along the longitudinal direction of the ceramic main body and beyond the first band portion.

10. The electronic component of claim 9, further comprising:
a first conductive joining layer to join the first junction part to the first external electrode, wherein the first junction part extends beyond the first conductive joining layer.

11. The electronic component of claim 5, wherein:
the first distance A is equal to the second distance B.

12. The electronic component of claim 5, wherein:
the first distance A is longer than the second distance B.

13. The electronic component of claim 1, wherein:
a length F of the first support part is a distance along the longitudinal direction of the ceramic main body between two opposite ends of the first support part,
a third distance C is a distance along the longitudinal direction of the ceramic main body from one of the two opposite ends of the first support part further from the first junction part, to the point at which the first connection part is connected to the first support part,
a fourth distance E is a distance along the longitudinal direction of the ceramic main body from one of outer peripheral surfaces or imaginary extension thereof of the first junction part, which is further from the ceramic main body, to the point at which the first connection part is connected to the first support part, and
the fourth distance E is 10% or more of the length of the ceramic main body and smaller than the length F of the first support part.

14. The electronic component of claim 13, wherein:
the third distance C is smaller than the fourth distance E.

15. The electronic component of claim 1, wherein:
a length F' of the second support part is a distance along the longitudinal direction of the ceramic main body between two opposite ends of the second support part,
a third distance C' is a distance along the longitudinal direction of the ceramic main body from one of two opposite ends of the second support part further from the second junction part, to the point at which the second connection part is connected to the second support part,
a fourth distance E' is a distance along the longitudinal direction of the ceramic main body from one of outer peripheral surfaces or imaginary extension thereof of the second junction part, which is further from the ceramic main body, to the point at which the second connection part is connected to the second support part, and the fourth distance E' is 10% or more of the length of the ceramic main body and smaller than the length F' of the second support part.

16. The electronic component of claim 15, wherein:
the third distance C' is smaller than the fourth distance E'.

17. The electronic component of claim 1, further comprising:
a first conductive joining layer to join the first junction part to the first external electrode, and
a second conductive joining layer to join the second junction part to the second external electrode.

18. The electronic component of claim 1, wherein the first support part directly contacts the first external electrode.

19. An electronic component comprising:
a ceramic main body having a preset length, width, and thickness;
first and second external electrodes respectively provided on two opposite end surfaces spaced apart from each other in a longitudinal direction of the ceramic main body;
a first metal frame comprising a first junction part joined to the first external electrode, a first support part extending from the first junction part in the longitudinal direction of the ceramic main body and configured to support the first external electrode, a first base part parallel to the first support part, and a first connection part configured to connect the first support part and the first base part, wherein the first connection part is connected to a point spaced apart from one end of the first support part along the longitudinal direction of the ceramic main body; and
a second metal frame comprising a second junction part joined to the second external electrode, a second support part extending from the second junction part in the longitudinal direction of the ceramic main body and configured to support the second external electrode, a second base part parallel to the second support part, and a second connection part configured to connect the second support part and the second base part,
wherein the second connection part is connected to a point spaced apart from one end of the second support part along the longitudinal direction of the ceramic main body,
wherein the first connection part of the first metal frame and the second connection part of the second metal frame are spaced apart from each other by a first distance A along the longitudinal direction of the ceramic main body,
wherein the first support part of the first metal frame and the second support part of the second metal frame are spaced apart from each other by a second distance B along the longitudinal direction of the ceramic main body, and
wherein the first distance A is longer than the second distance B.

* * * * *